United States Patent [19]

Davis, 3rd et al.

[11] 4,161,028
[45] Jul. 10, 1979

[54] ELECTRIC DEMAND CONTROL SYSTEM

[75] Inventors: Frederick B. Davis, 3rd, Drexel Hill; Charles W. Ross, Hatboro, both of Pa.

[73] Assignee: Leeds & Northrup Company, North Wales, Pa.

[21] Appl. No.: 910,320

[22] Filed: May 30, 1978

[51] Int. Cl.² ........................ A02J 13/00; G06G 7/62
[52] U.S. Cl. ..................................... 364/492; 307/97; 307/31; 364/105; 318/626
[58] Field of Search ...................... 364/492, 105, 493; 307/96, 97, 31, 34, 29, 38, 39, 116, 126; 318/626

[56] References Cited

U.S. PATENT DOCUMENTS

| | | | |
|---|---|---|---|
| 3,387,121 | 6/1968 | Maczuzak et al. | 364/492 |
| 3,419,772 | 12/1968 | Ross | 364/105 X |
| 3,454,749 | 7/1969 | Ross | 364/105 |
| 3,505,508 | 4/1970 | Leyde | 364/492 |
| 3,522,421 | 8/1970 | Miller | 364/492 |
| 3,539,785 | 11/1970 | Baker | 364/492 |
| 3,652,838 | 3/1972 | Dillon et al. | 364/492 |
| 3,872,286 | 3/1975 | Putman | 364/492 |
| 3,932,735 | 1/1976 | Giras | 364/105 X |
| 4,064,485 | 12/1977 | Leyde | 364/492 X |
| 4,075,699 | 2/1978 | Schneider et al. | 364/492 |
| 4,100,428 | 7/1978 | Delisle et al. | 364/492 X |
| 4,117,537 | 9/1978 | Muench | 364/492 |
| 4,125,895 | 11/1978 | Buhlmann | 364/492 X |

Primary Examiner—Edward J. Wise
Attorney, Agent, or Firm—William G. Miller, Jr.; Raymond F. MacKay

[57] ABSTRACT

There is disclosed a method and means for continuously controlling the consumption of power by an industrial customer wherein the control is accomplished by controlling the generation of the customer's own power source and/or his load in response to a signal representing the change necessary to make the energy consumed equal the demand limit. The gain of the control response is modified so that it is increased with increases in the difference between the energy actually consumed and the desired consumption.

11 Claims, 3 Drawing Figures

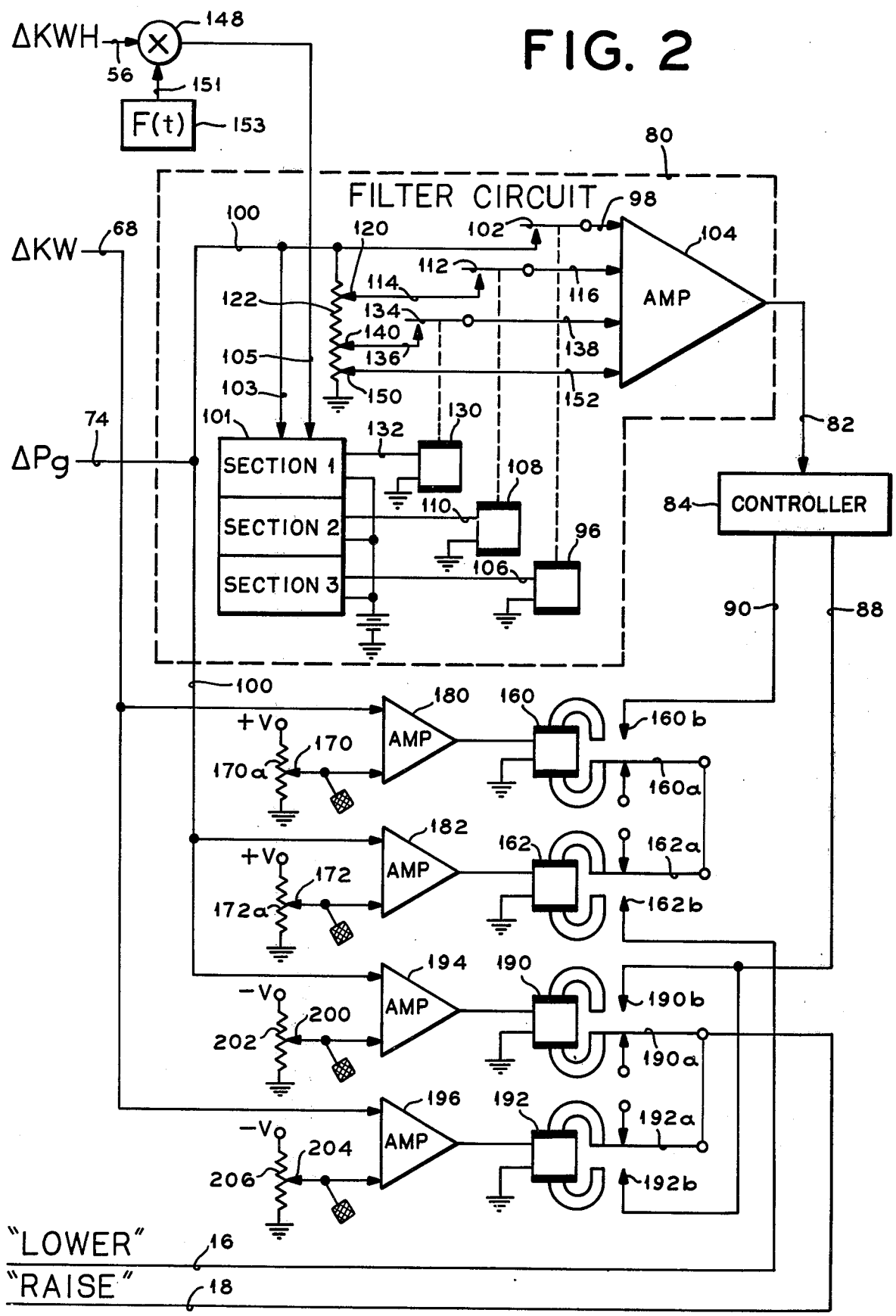

ELECTRIC DEMAND CONTROL SYSTEM

BACKGROUND OF THE INVENTION

Many of the industrial customers who receive power over a tie line from a power distribution system have generating capacity of their own which is controllable to assist in the maintenance of the energy demand of the customer during the demand periods over which his total consumption is necessarily restricted to minimize his energy costs. Some customers also have controllable loads which may be modified when the generation control has reached a limit.

It is well known that industrial customers selectively drop loads which are not controllable as may be necessary during a particular demand period in order to prevent the energy consumption from exceeding a predetermined demand limit established by contract with the power distribution system. When the industrial customer has generating capacity of his own and in some cases loads which are amenable to control, it is advantageous that the generating capacity be continuously modified so as to prevent the energy consumption from exceeding the demand limit at the end of a demand period thus making it unnecessary to modify any controllable load at the customer's facility unless his generating capacity has reached its limit.

It is an object of this invention to provide an improved control system for modifying the generation and load of an industrial customer to prevent his exceeding the energy demand limit for any demand period.

It is a further object of this invention to provide a system for controlling the generation of an industrial customer so that the generation is not changed in response to rapid fluctuations in the power flow to the customer.

It is a further object of this invention to provide a control system for controlling the generation in an industrial customer's plant so that the control will more aggressively operate to attempt to maintain the energy demand within the demand limit as the elapsed time in the demand period approaches closer to the end of the demand period.

SUMMARY OF THE INVENTION

The present invention provides a control system for controlling consumption of the power by a customer who receives that power from a distribution system for the purpose of preventing the consumption of energy by that customer from exceeding a predetermined demand limit during a predetermined demand period. The control system includes a means for determining the power transfer deviation as the changes in generation and load required by the customer under the existing conditions to make the energy transferred to the customer over the whole demand period correspond to the demand limit. There is also provided means for determining the energy transfer deviation as the deviation between the amount of energy actually transferred during the elapsed portion of the demand period and the desired energy transfer for that portion with means provided for controlling the generation and/or load in response to the power transfer deviation to tend to reduce that deviation towards zero. In addition to the control means, there is provided means for modifying the response of the control means in response to either a joint function of the energy transfer deviation and the unelapsed time in the demand period or a function only of said time or said deviation so as to increase the response of the control means with an increase in said energy transfer deviation and/or a decrease in the unelapsed time in the demand period.

BRIEF DESCRIPTION OF THE DRAWINGS

In the drawings:

FIG. 2 is a drawing partially in block diagram form showing one form which the control system of the present invention can take.

DESCRIPTION OF THE PREFERRED EMBODIMENTS

Figure 1:
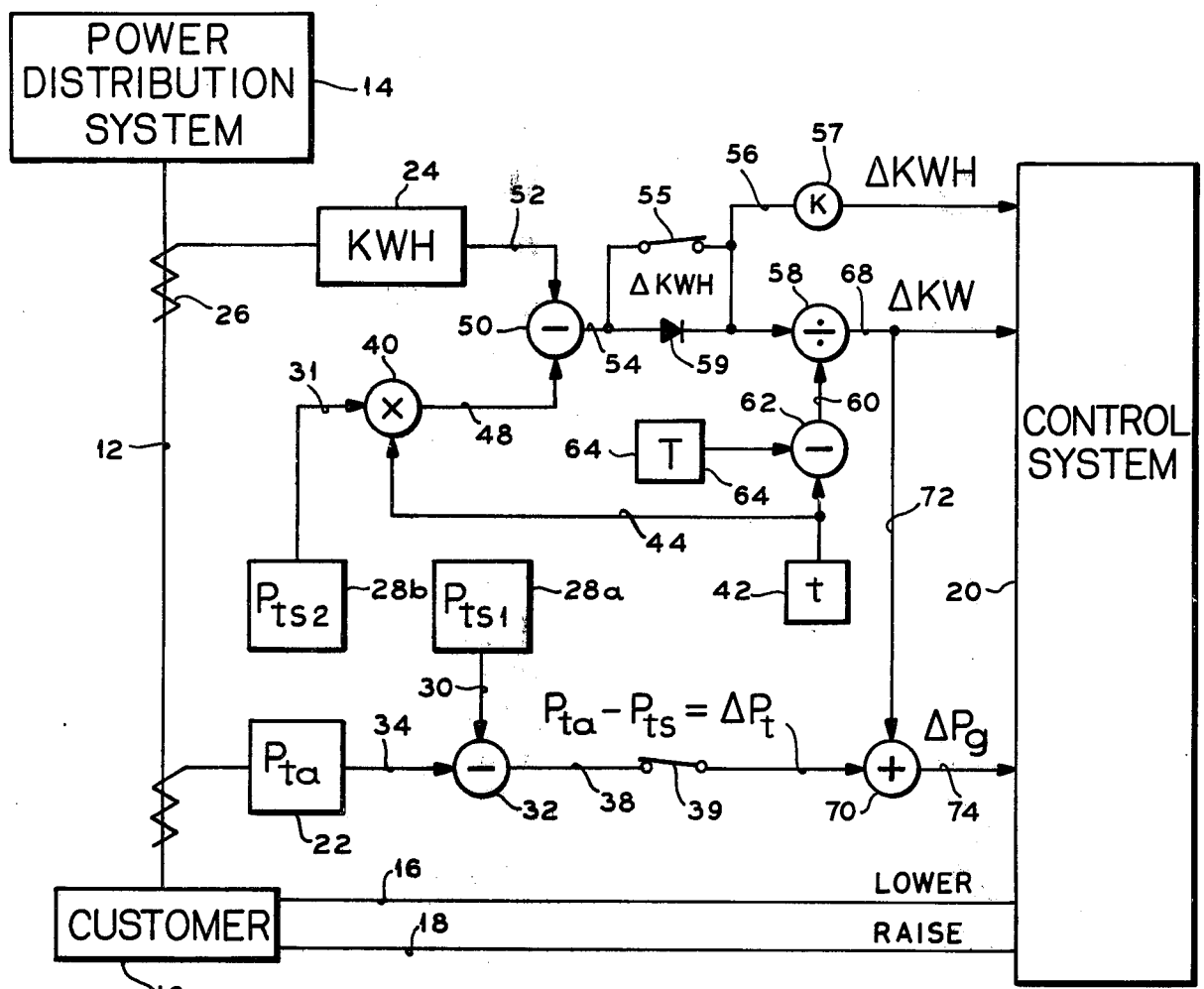
FIG. 1 is a block diagram representing the control system of the invention and particularly showing the manner in which the various parameters required for control may be computed.

In FIG. 1 there is shown as block 10 an industrial customer who is connected by way of tie line 12 to a power distribution system 14 so that the power distribution system 14 may supply over tie line 12 the power requirements of the customer. The customer, as indicated by block 10 of FIG. 1 may, for example, be an industrial customer who has his own generating capabilities that are subject to control and, in some cases, adjustable loads which are subject to control for the purposes of preventing the energy flow over tie line 12 for a particular demand interval from exceeding a predetermined demand limit. As shown in FIG. 1, the generating capacity of the customer may be controlled by the receipt of "lower" pulses over line 16 or "raises" over line 17 from the control system 20. The pulses supplied over lines 16 and 17 may be utilized both for the purpose of controlling the generation of the customer's generating capacity and for controlling the controllable loads present in the customer's plant.

To provide the necessary system parameters for operating the control system 20, both the amount of power transferred over tie line 12 and the amount of energy transferred over that tie line are measured. For example, the actual power transfer over tie line 12 is measured by KW meter 22 to provide a signal such as a potential of magnitude representative of the power being transferred, namely $P_{ta}$, while the energy being transferred over the tie line is being measured by the KWH meter 24 as by the accumulation of the pulses normally generated by contact closures on the watthour meter by which the distribution system measures energy transfer. Each pulse out of that meter represents a fixed amount of energy. The signal representing $P_{ta}$ could, of course, be integrated to obtain KWH; however, it is preferable to use the more accurate KWH meter since that meter determines the billing.

There is also provided as an input to the circuit of FIG. 1 a potential proportional to the desired power transfer over the tie line 12, $P_{ts1}$. This potential is supplied by the unit shown as block 28a with the potential appearing on line 30. The potential on line 30 is then compared by comparator 32 to the potential on line 34, which is generated by the KW meter 22 to be representative of the actual power transfer over tie line 12. As a result of that comparison, there is produced on line 38 a potential $\Delta P_t$ representative of the deviation of the power over tie line 12 from its desired value and equal to $(P_{ta} - P_{ts})$. $\Delta P_t$ may be referred to as the power transfer deviation. It will be understood that when it is desired that the customer's generation should be controlled to decrease as well as increase to reach the demand limit, then the desired value $P_{ts1}$ is matched by the value of $P_{ts2}$ as produced from block 28b. That value is normally the value which is obtained by taking the demand limit and dividing it by the total time in the demand period so as to thereby obtain a value for power flow over the tie line 12 which, if maintained over the entire demand period, will cause the customer to consume an amount of energy equal to the demand limit for that period.

The signal on line 31 from unit 28b is introduced as one input to the multiplier 40 which receives another input from the clock unit 42 which provides a potential on line 44 representative of the elapsed time in the existing demand period. There is then produced on line 48 a signal which represents the desired energy transfer from the tie line 12 for the elapsed portion of the period and that quantity is compared in comparator 50 with the output of the KWH meter 24 which appears on line 52. As a result of that comparison, there is provided on line 54 a measure of the deviation of the actual energy transfer over tie line 12 from the desired energy transfer which quantity may be represented as $\Delta$KWH and referred to as the energy transfer deviation. That quantity, which is positive when the energy consumed exceeds the desired amount, namely $P_{ts} \times t$, is provided as one input to the control system 20 by way of closed switch 55, input line 56, and potentiometer 57. It is also used as one input to the divider 58 whose other input from line 60 is obtained from the comparator 62 which compares the elapsed time in the demand period as established by unit 42 with a signal representing the total demand period as provided by unit 64. There is then provided as an output from the divider 58 on line 68 a quantity $\Delta$KW equal to $\Delta$KWH/T−t and representative of that power above or below the desired amount required to be transferred over the tie line during the unelapsed portion of the demand period to make the energy transferred during that period equal to the demand limit.

The quantity $\Delta$KW is also supplied to the summer 70 by way of line 72 where it is combined by addition to the signal on line 38 to provide an output $\Delta P_s$ on line 74 equal to ($\Delta$KWH/T-t)+$\Delta P_t$ representative of the change in generation and load required by the customer under existing conditions to make the energy transferred to the customer over the whole demand period correspond to the demand limit. That signal, which is positive when an increase in generation is required, is utilized as an input to control system 20 and is, in effect, the error signal to which the control system responds to produce the "lower" or "raise" pulses on lines 16 and 18.

The parameters $\Delta$KWH, $\Delta$KW, and $\Delta P_g$, which are shown in FIG. 1 as being inputs to the control system 20, may be calculated by computations which are different than those shown in FIG. 1. For example, the input $P_{ts2}$ from unit 28b may be replaced by an input representative of the demand limit. In that case it would still be possible to develop the required parameters except that the calculations required would be different than those shown in FIG. 1.

Sometimes the customer's operations are such that it is desirable to increase his generation to prevent exceeding the demand limit but it is not desired to decrease the generation in order to use power from the distribution system as, for example, when excess process steam is available for generating power. Then the switch 55 may be opened inserting diode 59 between lines 54 and 56. In that mode of operation, the setting $P_{ts1}$ of unit 28a may be different from the setting $P_{ts2}$ of unit 28b as when the control is operated to maintain a fixed flow over tie line 12.

In some situations the customer desires to allow the tie line 12 to float and control the generation from another parameter such as steam back pressure. In that situation switch 37 is opened.

The control system 20 of FIG. 1 is shown in one preferred form in FIG. 2 wherein the inputs of the required parameters are shown being supplied to the control sytem over lines 56, 68, and 74, with the "lower" and "raise" pulses being provided over lines 16 and 18, respectively.

The control system of FIG. 2 is shown as comprising a filter circuit 80 which is connected to receive the inputs from lines 56 and 74 so as to produce an input on line 82 as an input to the controller 84, which produces "raise" pulses on output line 88 and "lower" pulses on output line 90 in accordance with the response of the controller to the signal on line 82.

The filter circuit 80 of FIG. 2 may be of the type shown, for example, in FIG. 2 of U.S. Pat. No. 3,419,772 issued to one of the present inventors, C. W. Ross, on Dec. 31, 1968. As will be evident from the circuit of the filter circuit 80, the error signal to the controller which appears on line 82 may be directly responsive to the full magnitude of the signal $\Delta P_g$ appearing on line 74 when the relay 96 is energized by section 3 of the gain selection circuit 101, thus connecting line 74 to line 98 by way of the connection of line 74 to line 100 and the closed contact 102 with the appropriate amplification, 0.5 for example, as it may be provided by summing amplifier 104.

If there is an energization of relay 108 by a signal on line 110 from section 2 of selector 101, then the movable relay contact 112 will be closed so as to connect line 114 to the input line 116 of amplifier 104. The result of energization of relay 108 will be that the error signal appearing on line 82 will be modified by a gain factor less than that which is applicable with the energization of relay 96 for the signal provided on line 114 is obtained from the variable tap 120 on the tapped resistor 122 which is shown as being connected between line 100 and ground. Thus the input on line 116 may, for example, be such that a gain factor of 0.2 is added.

Similarly, if relay 130 is energized by a signal on line 132 from section 1 of the gain selector, then the movable contact 134 is made with the fixed contact connected to line 136 to provide an input on line 138 to amplifier 104 as determined by the variable tap 140 on potentiometer 122. There may thus be provided a gain factor which may also be 0.2 relating $\Delta P_g$ to the error signal on line 82.

If none of the relays 96, 108, or 130 is energized, then the error signal on line 82 is decreased to its minimum since the error signal is obtained from the variable tap 150 by way of line 152 with the variable tap 150 being positioned to provide the amplifier 104 with a decreased input or by providing a gain factor of 0.1, for example.

It will be evident from the above explanation that the gain of the control system of FIG. 2 is varied by the selective energization of the relays 96, 108, or 130, with the minimum gain being established by the position of the tap 150. Thus, the inputs to the three sections of the gain selector 101 over lines 103 and 105 determine the effective gain of the control system and hence its response to the signal on line 74. The maximum gain with all relays 96, 108, and 130 energized may, for example, be one using the various gain factor suggested above.

The signal on line 103 is derived from line 100 which is, in turn, obtained from line 74 and is therefore proportional to $\Delta P_g$, whereas the signal on line 105 is obtained from the output of the multiplier 148 which has as its inputs the signal on line 56 representative of $\Delta$KWH and the signal on line 151 representative of some function of the elapsed time in the existing demand period, which signal is produced by the unit 153. The particular function of the elapsed time, t, which is utilized, may be t/T; where T is the total demand period, and t is the elapsed time; or the function may be 1/T−t or t/t. The effect of these functions in the control system will be further explained subsequently. It will be recognized that the signal on line 105 can be a joint function of the energy transfer deviation and the unelapsed time or it may be a function of only one of them. Thus when F(t) is t/t only variations in $\Delta$KWH are effective. Likewise, the the potentiometer 57 of FIG. 1 can be set so that the signal to controller 20 is zero regardless of the value of $\Delta$KWH.

Figure 3:
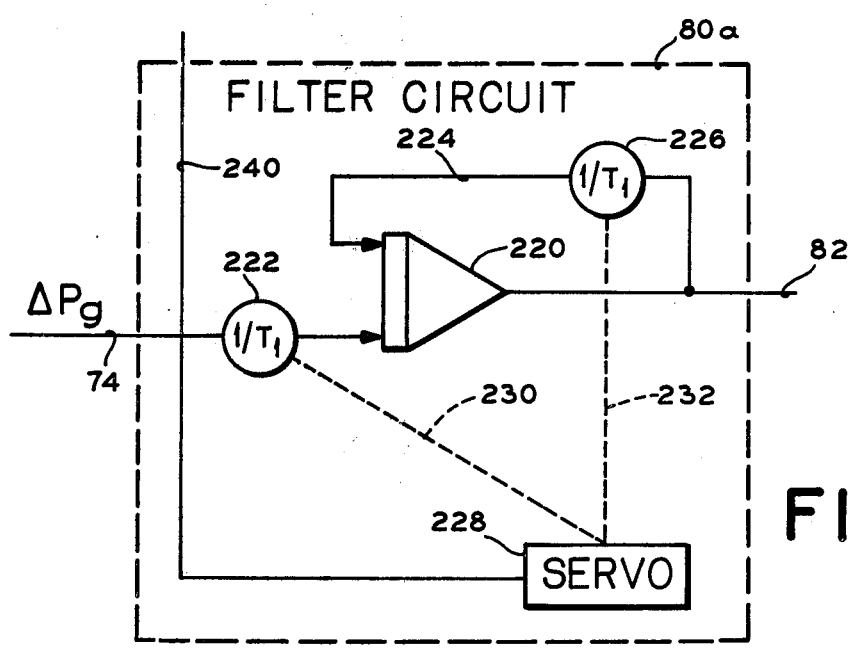
FIG. 3 is a circuit drawing showing a filter circuit which may be used in place of the filter circuit shown in FIG. 2.

The three sections of the gain selector 101 may be circuits of the type shown in FIG. 3 of the Ross U.S. Pat. No. 3,419,772, with the modification that the signal on line 105 of FIG. 2 of the present description is connected directly to line 185 of FIG. 3 of the Ross patent with the omission of the integrator 180 and the amplifier 170 of FIG. 3 of the Ross patent and its associated circuitry. Thus, in effect, sections 1, 2, and 3 of the gain selector differ from FIG. 3 of the Ross patent in that the integral of the error signal is not obtained by integrating $\Delta P_g$, but is obtained by a separate signal, namely $\Delta$KWH as determined by modifying the difference between the measured KWH and its desired value with a function of the elapsed time in the demand period as produced by the unit 153. The disclosure of U.S. Pat. No. 3,419,772 is hereby incorporated by reference for purposes of further describing the manner of operation of the filter circuit 80, and more particularly of the gain selector 101 which may be similar to FIG. 3 of the patent.

In effect, the gain selector 101 is operable by selective energization of its associated relays 96, 108, and 130 to modify the gain of the filter circuit and hence of the control system in such a manner that the gain is increased as $\Delta P_g$ increases. Each section of the gain selector may be arranged to energize its associated relay only if the signal on line 103 exceeds a predetermined value for a predetermined period of time with each of the sections being set up to have different predetermined values and, if desired, different predetermined times associated with them. The value of the signal on line 105 is utilized in each of the sections of 101 as a means for changing the predetermined value which must be reached by the signal on line 103 in each of the sections. For example, as the signal on 105 increases, the predetermined values set for each section normally changes so that the response of the control is increased by increasing the gain of the controller. With the gain selector so constructed, it will be evident that the input to the controller on line 82 will not vary in response to fluctuations of the signal $\Delta P_g$ on line 74 unless those fluctuations are such magnitude and duration that one of the relays 96, 108, and 130 are energized by selector 101. Thus, the filter circuit is effective to vary the gain of the control signal of FIG. 2 in accordance with the magnitude and duration of $\Delta P_g$ so as to avoid the controller 84 taking control action in response to signals which represent only transient phenomenon or short term load changes.

The controller 84 may be a controller of the type set forth in U.S. Pat. No. 3,008,072 issued to T. W. Jenkins, Jr., et al. on Nov. 7, 1961 which is effective to produce either "raise" pulses on line 88 or "lower" pulses on line 90, which pulses will be of duration varying with the magnitude of the error signal on line 82 depending upon the functions incorporated in the control such as proportional, reset, or rate. The disclosure of U.S. Pat. No. 3,008,072 is hereby incorporated by reference for the purpose of further describing the operation of controller 84. It should be recognized that the lines 88 and 90 of FIG. 2 of the present description may correspond with the lines 71 and 72 of FIG. 1 of that patent.

The "raise" and "lower" pulses provided as outputs on lines 88 and 90 from the controller 84 are sent to the customer's generation and load control circuits only after passing through a circuit that is designed to apply permissive constraints to those pulse signals. For example, the "lower" pulses which appear on line 90 will be transmitted to line 16 only when both polarized relays 160 and 162 have been energized so that their respective movable contacts 160a and 162a are moved into contact with the fixed contacts 160b and 162b, respectively. The coincident energization of relays 160 and 162 will occur only when both the signal $\Delta$KW on line 68 and $\Delta P_g$ on line 100 are sufficiently negative to exceed the respective limit potentials established by the movable contacts 170 and 172 on potentiometers 170a and 172a as they are present. Both the potentiometers 170a and 172a are supplied by a source having a potential +V so that the positioning of the contacts 170 and 172 determine one of the inputs to each of the respective amplifiers 180 and 182. As shown in FIG. 2, the other input to amplifier 180 is from line 68 and the other input to amplifier 182 is from line 100.

It will thus be evident that lower pulses to decrease the generation by the customer or to increase his load would not be transmitted to the customer over line 16 except where there is a coincident presence of negative potentials representing $\Delta P_g$ and $\Delta$KW which exceed the respective limit settings established by the position of contacts 172 and 170. Thus, the generation of the customer will never be decreased when either $\Delta P_g$ or $\Delta$KW are of sense calling for an increase.

The "raise" signals which appear on line 88 from controller 84 are transmitted on line 18 to the customer for increasing his generation or decreasing his load when any one of the relays 190 and 192 are energized by the outputs from their respective amplifiers 194 and 196. Thus, it is only necessary for one of the movable contacts 190a and 192a to be energized to be in contact with 190b or 192b before the pulse on line 88 will be transmitted to line 19. Thus, when controller 84 calls for an increase in generation, it will not be necessary that $\Delta$KW to be of sense indicating an increase in generation is desired.

Each of the amplifiers 194 and 196 has as one of its inputs the potential derived from a voltage divider for establishing threshold values above which the relays 190 and 192 will be energized to a different polarity. Thus, the movable contact 200 is adjusted on the potentiometer 202 which is supplied from a potential −V. Similarly the contact 204 is adjusted along the potential resistance 206 which is supplied from a potential −V. By adjustment of the contact 200 there may be determined the positive potential which must be reached by line 100 which represents $\Delta P_g$ before the polarized relay 190 will be energized to the opposite polarization so as to close the movable and fixed contacts 190a and 190b. Similarly, the position of contact 204 determines the positive potential which must be reached by line 68 representing $\Delta KW$ before the line 192 will close the contacts 192a and 192b. It will therefore be evident that when either $\Delta KW$ or $\Delta P_g$ exceeds its predetermined threshold value as set by contacts 200 and 204 respectively, the "raise" pulse will be sent from the controller 84 to the customer by way of line 18.

In FIG. 3 there is shown a filter circuit 89a which may be substituted for the filter circuit 80 of FIG. 2. The filter circuit 80a includes the integrating amplifier 220 which has one input representing $\Delta P_g$ from line 74 which is introduced by way of the potentiometer 222 which represents the reciprocal of the time constant $T_1$ for the filter circuit. The integrating amplifier 220 also includes in its feedback circuit 224 a potentiometer 226 which represents the reciprocal of the time constant of the filter circuit. As shown in FIG. 3, the feedback is supplied to the input of amplifier 220 from its output line 82 over line 224 through potentiometer 226.

In FIG. 3 the potentiometers 222 and 226 are simultaneously adjusted by the Servo 228 so that the adjustment of the potentiometers 222 and 226 by way of the mechanical linkages 230 and 232 are proportional to the input signal provided to the Servo 228 over line 240. The line 240 may preferably be connected to receive an input F(t) as from unit 153 so that the first-order lag produced by the filter circuit 80a has a time constant which varies with the function of the elapsed time in the demand period as established by the function F(t). Alternatively, the signal on line 240 may be derived from line 105 of FIG. 2, in which case it will represent the product of $\Delta KWH$ and the function F(t). It will be evident that the function of the filter circuit 80a is thus to filter out the changes in $\Delta P_g$, which are only short-lived, while allowing the controller to respond more quickly as the elapsed time in the period increases.

SUMMARY

A typical operation of the control circuit of FIG. 2, as it may characteristically be utilized to control the generation of an industrial customer's plant in order to prevent his consumption of energy from exceeding a demand limit, and to utilize a maximum amount of energy from the distribution system, is set forth below.

The signal $\Delta P_g$, which represents the change in generation required to reach the demand limit at the end of the demand interval, operates through amplifier 104 and the various gain changing potential taps 120, 140, and 150 to provide an error signal for controller 84, which is effective to produce the controlling signals, which are either "raise" or "lower" signals on lines 88 or 90. Those signals, when permitted to pass through the permissive constraints established by the relays 160, 162, 190, and 192, will be effective to change the generation in the customer's plant so that it tends to reduce the signal $\Delta P_g$ towards zero. As will be evident from FIG. 2, the signal $\Delta P_g$ is used as one input to gain selector 101 so that, as $\Delta P_g$ increases, the gain of the control system is increased by the sequential energization of relays 130, 108, and 96 with increasing values of $\Delta P_g$ and its time duration.

As the demand period approaches its end, it is desirable to aggressively control so as to maintain $\Delta KWH$, which represents the difference between the energy used and the amount allowed, at a zero value; thus, the magnitude of $\Delta P_g$ which is required to energize the relays 130, 108, and 96 in selector 101 tends to be decreased as the signal on line 105 increases. The signal on line 105 will not only be a function of $\Delta KWH$, but it will also be a function of time, F(t), which can typically be a function which increases as the demand period progresses. By using such a function as, for example, t/T or 1/T−t, the gain of the control system will be higher for a particular value of $\Delta P_g$ toward the end of the demand period than would be the case toward the beginning of that period, thus, the control system tends to aggressively control at the end of the period ot keep $\Delta KWH$ at zero.

The permissive constraints which are introduced by relays 160, 162, 190, and 192, are effective to further assist in maintaining the energy use at a value which will not exceed the demand limit. To carry out that objective, the potential taps 200 and 204 will normally be set at ground potential so that all "raise" pulses on line 88 will be transmitted through line 18 to the customer's generation control, for the presence of "raise" signals on line 88 would be indicative of the fact that the consumption of energy has been excessive for the portion of the demand interval that has elapsed. Thus "raise" pulses are allowed to go through the permissive constraint regardless of whether $\Delta KW$ or $\Delta P_g$ are of the same magnitude or not and usually even when their magnitude is small.

On the other hand, the taps 170 and 172 may be set at something other than zero when it is desired to prevent the passing of "lower" signals over line 90 to line 16 unless both $\Delta KW$ and $\Delta P_g$ attain the values required to exceed the settings of taps 170 and 172. Thus, toward the end of the demand period, if the energy consumption by the customer is less than the amount allowed, the generation may be decreased but only if $\Delta P_g$ and $\Delta KW$ are in the same sense which would provide assurance that a decrease in generation can be tolerated without the possibility of the demand limit being exceeded.

It will be evident from the above description that the control system of FIG. 2 is effective to filter any noise in the signal $\Delta P_g$ so that it does not affect the control of the customer's generation and the system is also effective to aggressively control to reduce large values of $\Delta P_g$ and to aggressively control to reduce any values of $\Delta KWH$ toward the end of the demand interval while giving selective treatment of the "raise" and "lower" pulses generated by the controller so as to further assure that the energy consumption will reach the demand limit without exceeding it.

With the substitution of the filter circuit of FIG. 3 for that shown in FIG. 2, the control system will be insensitive to fluctuations in $\Delta P_g$ until the signal on line 240, which may be a function of elapsed time in the demand interval as, for example, t/T or 1/T−t is effective through Servo 228 to decrease the time constant of the filter circuit so that the error signal to the controller on line 82 will more closely respond to changes in $\Delta P_g$ in order to maintain the energization at a value which will approach the demand limit at the end of the demand interval.

The above mentioned control actions can be effective for the purpose of modifying adjustable loads in the customer's plant when the generating capacity of his plant has been adjusted to its limit with the load, of course, being adjusted in a reverse sense in order to maintain the energy combination within the demand limit for any demand interval.

What is claimed is:

1. A control system for controlling the consumption of power by a customer over a tie line connected to transfer power between a distribution system and said customer without the consumption exceeding a predetermined energy demand limit during a predetermined demand period, comprising:
   means for determining the power transfer deviation as the change in generation or load required by the customer under existing conditions to make the energy transferred to the customer over the whole demand period correspond to the demand limit;
   means for determining the energy transfer deviation as the deviation between the amount of energy actually transferred during the elapsed portion of the existing demand period and the desired energy transfer for that portion;
   means for controlling said generation or load in response to said power transfer deviation to tend to reduce that deviation toward zero; and
   means for modifying the response of said control means in response to a quantity which is a joint function of said energy transfer deviation and the unelapsed time in the demand period.

2. A control system for controlling the consumption of power by a customer over a tie line connected to transfer power between a distribution system and said customer without the consumption exceeding a predetermined energy demand limit during a predetermined demand period, comprising:
   means for determining the power transfer deviation as the change in generation or load required by the customer under existing conditions to make the energy transferred to the customer over the whole demand period correspond to the demand limit;
   means for determining the energy transfer deviation as the deviation between the amount of energy actually transferred during the elapsed portion of the existing demand period and the desired energy transfer for that portion;
   means for controlling said generation or load in response to said power transfer deviation to tend to reduce that deviation toward zero; and
   means for modifying the response of said control means in response to a quantity which is a function of the unelapsed time in the demand period.

3. A control system for controlling the consumption of power by a customer over a tie line connected to transfer power between a distribution system and said customer without the consumption exceeding a predetermined energy demand limit during a predetermined demand period, comprising:
   means for determining the power transfer deviation as the change in generation or load required by the customer under existing conditions to make the energy transferred to the customer over the whole demand period correspond to the demand limit;
   means for determining the energy transfer deviation as the deviation between the amount of energy actually transferred during the elapsed portion of the existing demand period and the desired energy transfer for that portion;
   means for controlling said generation or load in response to said power transfer deviation to tend to reduce that deviation toward zero; and
   means for modifying the response of said control means in response to a quantity which is a function of said energy transfer deviation.

4. A control system as set forth in claim 1 or 2 in which said time function is the reciprocal of the quantity calculated as the total time in the period minus the elapsed time.

5. A control system as set forth in claim 1 or 2 in which said time function is calculated as the elapsed time divided by the total time in the period.

6. A control system as set forth in claim 1, 2, or 3, which includes:
   means for determining the average power required to be transferred over said tie line during the unelapsed portion of the demand period to make the energy transferred during the period equal to the demand limit;
   means for preventing said control means from increasing the customer's generation or decreasing the customer's load when neither said power transfer deviation nor said average power requirement is in sense such that said control means call for control action of such sense and is of magnitude exceeding a predetermined value;
   means for preventing said control means from decreasing said generation or restoring the load when either said power transfer deviation or said average power requirement is in sense such that said control means calls for that sense of change and is of magnitude exceeding a predetermined value.

7. A control system as set forth in claim 1, 2, or 3, in which said control modifying means filters out the effect on said control means of rapid fluctuations in said power transfer deviations.

8. A control system as set forth in claim 1, 2, or 3, in which said modifying means introduces a first-order lag in the power transfer deviation input to the controller with the time constant of the lag being a function of said quantity.

9. A control system as set forth in claim 1, 2, or 3, in which said modifying means is a filter means which modifies the gain of said control when the power transfer deviation exceeds a predetermined limit for a predetermined time.

10. A control system as set forth in claim 1 or 3 in which said modification is only in a sense such that the response of said control means is increased for values of said power transfer deviation which cause the controller to call for an increase in generation or a decrease in load.

11. The method for controlling the generation of power by a customer connected through a tie line to transfer power between a distribution system and said customer without the customer's consumption exceeding a predetermined energy demand limit for a predetermined demand period, comprising the steps of:
   determining the power transfer deviation as a change in generation required by the customer under existing conditions to make the energy transferred to the customer over the whole demand period correspond to the demand limit;
   determining the energy transfer deviation as the deviation between the amount of energy actually transferred during the elapsed portion of the existing demand period and the desired energy transfer for that portion;
   controlling said generation in response to said power transfer deviation to tend to reduce said power transfer deviation toward zero; and
   modifying said control in response to said energy transfer deviation so as to increase the gain of the control response as said energy transfer deviation increases.

* * * * *